(12) United States Patent
Xu et al.

(10) Patent No.: US 8,063,637 B2
(45) Date of Patent: Nov. 22, 2011

(54) SYSTEM AND METHOD FOR PHASE RELAXED RF PULSE DESIGN

(75) Inventors: Dan Xu, Oconomowoc, WI (US); Kevin F. King, Menomonee Falls, WI (US); Graeme C. McKinnon, Hartland, WI (US)

(73) Assignee: General Electric Company, Schenectady, NY (US)

( * ) Notice: Subject to any disclaimer, the term of this patent is extended or adjusted under 35 U.S.C. 154(b) by 248 days.

(21) Appl. No.: 12/424,797

(22) Filed: Apr. 16, 2009

(65) Prior Publication Data
US 2010/0264926 A1 Oct. 21, 2010

(51) Int. Cl.
*G01V 3/00* (2006.01)
(52) U.S. Cl. ....................................................... 324/314
(58) Field of Classification Search .......... 324/300–322; 600/410–435
See application file for complete search history.

(56) References Cited

U.S. PATENT DOCUMENTS

| | | | | |
|---|---|---|---|---|
| 5,349,294 | A * | 9/1994 | Kasuboski | 324/309 |
| 5,572,126 | A * | 11/1996 | Shinnar | 324/314 |
| 7,466,131 | B1 | 12/2008 | Xu et al. | |
| 7,705,594 | B2 * | 4/2010 | Xu et al. | 324/307 |
| 2008/0238425 | A1 | 10/2008 | Xu et al. | |

OTHER PUBLICATIONS

Katscher et al., Transmit Sense, Magnetic Resonance in Medicine 49: 144-150 (2003), published online in Wiley InterScience (www.interscience.wiley.com).

Yudong Zhu, Parallel Excitation With an Array of Transmit Coils, Magnetic Resonance in Medicine 51: 775-784 (2004), published online in Wiley InterScience (www.interscience.wiley.com).

Grissom et al., Spatial Domain Method for the Design of RP Pulses in Melticoil Parallel Excitation, Magnetic Resonance in Medicine 56: 620-629 (2006), published online Aug. 7, 2006 in Wiley InterScience (www.interscience.wiley.com).

Saekho et al., Fast-kz Three-Dimentional Tailored Radiofrequency Pulse for Reduced B1 Inhomogeneity, Magnetic Resonance in Medicine 55: 719-724 (2006), published online Mar. 8, 2006 in Wiley Interscience (www.interscience.wiley.com).

Schulte et al., Magnitude-Constrained Spokes Design for B1 Inhomogeneity Correction, Proc. Intl. Soc. Mag. Reson. Med. 16 (2008), p. 3135.

A.B. Kerr et al., "Phase constraint relaxation in parallel excitation pulse design," Proc. 15th Ann. Meet. Intl. Soc. Mag. Reson. Med., p. 1694, Berlin, Germany, May 2007.

J. Pauly et al., "A k-space analysis of small-tip-angle excitation," J. Magn. Reson., vol. 81, pp. 43-56, 1989.

M.R. Hestenes, "Methods of conjugate gradients for solving linear systems," J. Res. Nat. Bur. Stand, vol. 49, pp. 409-436, 1952.

D. Xu et al., "A non-iterative method to design large-tip-angle multidimensional spatially selective radiofrequency pulses for parallel transmission," Magn. Reson. Med., vol. 58, pp. 326-334, 2007.

R. Stollberger et al., "Imaging of the active B1 field in vivo," Magn. Reson. Med., vol. 35, pp. 246-251, 1996.

D. Xu, et al., "Designing multichannel, multidimensional, arbitrary flip angle RF pulses using an optimal control approach," Magn. Reson. Med. 2007.

(Continued)

*Primary Examiner* — Dixomara Vargas

(57) ABSTRACT

Techniques for designing RF pulses may be configured to produce improved magnitude profiles of the resulting magnetization by relaxing the phase constraint and optimizing the phase profiles. In one embodiment, a spinor-based, optimal control, optimal phase technique may be used to design arbitrary-tip-angle (e.g., large and small tip angle) RF pulses (both parallel transmission and single channel). In another embodiment, small tip angle RF pulses (both parallel transmission and single channel) may be designed using a small-tip-angle (STA) pulse design without phase constraint that is formulated as a parameter optimization problem.

20 Claims, 5 Drawing Sheets

OTHER PUBLICATIONS

S. Conolly et al., "Optimal control solutions to the magnetic resonance selective excitation problem," IEE Trans. Med. Image, vol. MI-5, pp. 106-115, 1986.

E.T. Jaynes, "Matrix treatment of nuclear induction," Phys. Rev., vol. 98, pp. 1099-1105, 1955.

J. Pauly et al., "Parameter relations for the Shinnar-Le Roux selective excitation pulse design algorithm,"IEEE Trans. Med. Imag., vol. 10, p. 53-65, 1991.

M. Lustig et al., "Sparse-MRI: the application of compressed sensing for rapid MR imaging," Magn. Reson. Med., 58: 1182-1195 (2007).

* cited by examiner

SYSTEM AND METHOD FOR PHASE RELAXED RF PULSE DESIGN

TECHNICAL FIELD

The present invention relates generally to magnetic resonance imaging (MRI) systems and in particular, to a system and method for phase relaxed RF pulse design.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). A MRI system also comprises components called gradient coils that produce smaller amplitude, spatially varying magnetic fields when current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

During a transmit sequence, an MR system will transmit RF pulses of given frequencies having particular amplitude profiles while various magnetic field gradients are being applied. For example, in a spin-echo sequence, an MR system would transmit an excitation pulse at a particular frequency, amplitude and transmit power for a particular time, in order to induce a net transverse magnetization in nuclei of a scan subject. Subsequent pulses transmitted by the system may have the same or similar frequency, but might have different gain, amplitude, and duration attributes to cause a different change in magnetization (or "flip angle") in order to cause spin echoes. Thus, in general, the particular shapes of the RF pulses in a transmit sequence are varied to manipulate the net magnetization in nuclei of the scan subject.

MR systems may transmit RF pulses using a single channel (or coil) or using multiple channels (known as parallel transmission). In parallel transmission, each coil exhibits a spatially different sensitivity pattern and is driven by an independently controlled RF waveform generator with a separate power amplifier. The different spatial sensitivity patterns of the coils provide additional ability of spatial selectivity in addition to the inherent spatial selectivity from RF pulses. The additional spatial selectivity has been used to reduce pulse length or to reduce error in the resulting magnetization.

Two primary applications of parallel transmission are reduced field of view (FOV) excitation and B1 inhomogeneity correction.

Many parallel transmission pulse design methods are based on the small-tip-angle (STA) approximation. In the STA approximation, it is assumed that the initial magnetization vector points in +z direction (positive longitudinal direction) and that the flip angle is small (e.g., <30° or at most 90° depending on the error tolerance and the k-space trajectory used). Based on these assumptions, the Bloch equation is reduced to the following linear equation (which ignores relaxation):

$$p(r) = i\gamma \sum_{l=1}^{L} s_l(r) \int_0^T b_l(t) e^{ik(t) \cdot r} dt, \quad \text{Eqn. 1}$$

where $p(r)$ is the desired normalized transverse magnetization profile (i.e., $p(r) = M_{xy,desired}(r)/M_0$) at spatial location $r=(x,y,z)$, $\gamma$ is gyromagnetic ratio, $T$ is pulse duration, $k(t)$ denotes the chosen excitation k-space trajectory, $s_l(r)$ represents the transmit sensitivity of the lth coil, and $b_l(t)$ denotes the RF pulse waveform to be designed for the lth coil, $l=1, 2, \ldots, L$. By discretizing the time axis as $0, \Delta t, 2\Delta t, \ldots, (N-1)\Delta t$ (where N is the number of time points and $\Delta t$ is the step size) and space axes as $r_1, r_2, \ldots, r_M$ (where M is the number of voxels), and denoting $p_m = p(r_m)$, $m=1, 2, \ldots, M$, Eqn. 1 can be converted into a matrix form:

$$\underbrace{\begin{bmatrix} p_1 \\ p_2 \\ \vdots \\ p_M \end{bmatrix}}_{p} = \sum_{l=1}^{L} i\gamma \Delta t \quad \text{Eqn. 2}$$

$$\underbrace{\begin{bmatrix} s_l(r_1)e^{ik(0) \cdot r_1} & s_l(r_1)e^{ik(\Delta t) \cdot r_1} & \cdots & s_l(r_1)e^{ik[(N-1)\Delta t] \cdot r_1} \\ s_l(r_2)e^{ik(0) \cdot r_2} & s_l(r_2)e^{ik(\Delta t) \cdot r_2} & \cdots & s_l(r_2)e^{ik[(N-1)\Delta t] \cdot r_2} \\ \vdots & \vdots & \ddots & \vdots \\ s_l(r_M)e^{ik(0) \cdot r_M} & s_l(r_M)e^{ik(\Delta t) \cdot r_M} & \cdots & s_l(r_M)e^{ik[(N-1)\Delta t] \cdot r_M} \end{bmatrix}}_{S_l} \underbrace{\begin{bmatrix} b_l(0) \\ b_l(\Delta t) \\ \vdots \\ b_l((N-1)\Delta t) \end{bmatrix}}_{b_l}$$

Or, in short, $$p = Sb, \quad \text{Eqn. 3}$$

where $p$ is a length-M vector (a column vector), $S=[S_1, S_2, \ldots, S_L]$ is an M×LN matrix, and $b=[(b_1)^T, (b_2)^T, \ldots, (b_L)^T]^T$ (unitalicized T denotes matrix transpose) is a length-LN vector. To solve Eqn. 3, and RF power-regularized least square formulation is used resulting in:

$$\text{Choose } b \text{ to minimize } \|Sb-p\|_w^2 + \lambda \|b\|_2^2, \quad \text{Eqn. 4}$$

The weighted $l_2$ norm $\|Sb-p\|_w^2 = (Sb-p)^H W(Sb-p)$ (H denotes the Hermitian transpose) in Eqn. 4 for a given spatial weighting matrix $W=\text{diag}\{w_1, w_2, \ldots, w_M\}$ ($w_m \geq 0$, $\forall m$) represents the overall error of the final magnetization profile.

The $l_2$ norm $\|b\|_2^2 = b^H b$ represents the RF power and $\lambda$ is a positive scalar (referred to as a regularization parameter) that balances the error and RF power terms. The quadratic objective function in Eqn. 4 can be solved by a standard conjugate gradient (CG) method or by explicit matrix inversion:

$$b^* = (S^H W S + \lambda I)^{-1} S^H W p.\qquad\text{Eqn. 5.}$$

The desired magnetization p in Eqn. 4 contains a desired magnitude profile and a constant phase profile (e.g., zero phase). This is overly constrained because a parallel transmission array does not necessarily favor excitation with flat phase. Therefore, it is generally advantageous to relax the constant phase constraint in Eqn. 4 in parallel transmission RF pulse design when the phase profile of the final magnetization is not of interest, as is the case in most of the MRI applications. In one known phase relaxed parallel transmission pulse design, the phase of one of the eigenmodes of the transmit sensitivities is chosen that has the minimum magnitude error as the initial predetermined target phase profile for p and then the phase profile is iteratively update with the phase of Sb in the CG iterations.

Conventional STA parallel transmission designs can have the following limitations: 1) an un-optimized magnitude profile of the transverse magnetization as a result of enforcing an overly restrictive flat phase profile and 2) only small tip angle pulses can be accurately designed. Various STA based parallel transmission RF pulse designs have been developed to address the first limitation by using a phase relaxed design using predetermined constant or non-constant phase profiles. Methods to design large tip angle or arbitrary tip angle parallel transmission RF pulses have been developed that utilize optimal control design.

It would be desirable to provide a system and method capable of producing accurate parallel transmission (or multi-channel) RF pulse waveforms with an optimal phase profile. It would also be desirable to have embodiments of such system and method which could account for large tip angles, small tip angles or arbitrary tip angles.

BRIEF DESCRIPTION OF THE INVENTION

In accordance with an embodiment, a method for magnetic resonance (MR) imaging includes determining at least one RF pulse profile, identifying a set of desired magnetization parameters, iteratively adjusting the at least one RF pulse profile based on the set of desired magnetization parameters using a spinor-based, phase relaxed, optimal control formulation and causing an RF coil array to transmit at least one RF pulse based on the at least one adjusted RF pulse profile to acquire MR imaging data.

In accordance with another embodiment, a magnetic resonance (MR) imaging apparatus includes a plurality of gradient coils positioned about a bore of a magnet, an RF transceiver system and switch controlled by a pulse module to transmit RF signals to an RF coil array to acquire MR images, and a computer operatively connected to the pulse module and programmed to determine at least one RF pulse profile, to determine a set of desired magnetization parameters, to iteratively adjust the at least one RF pulse profile based on the set of desired magnetization parameters using a spinor-based, phase relaxed optimal control formulation, to cause the pulse module to generate RF pulses for transmission by the RF coil array based on the at least one adjusted RF pulse profile to acquire MR image data, and to, at least temporarily, store the MR image data in memory.

In accordance with another embodiment, a method for magnetic resonance (MR) imaging includes determining at least one RF pulse profile, identifying a set of desired magnetization parameters, iteratively adjusting the at least one RF pulse profile based on the set of desired magnetization parameters using a phase relaxed small-tip-angle formulation configured to generate an optimal phase profile, and causing an RF coil array to transmit at least one RF pulse based on the at least one adjusted RF pulse profile to acquire MR image data.

BRIEF DESCRIPTION OF THE DRAWINGS

Embodiments are illustrated by way of example and not limitation in the figures of the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Figure 1:
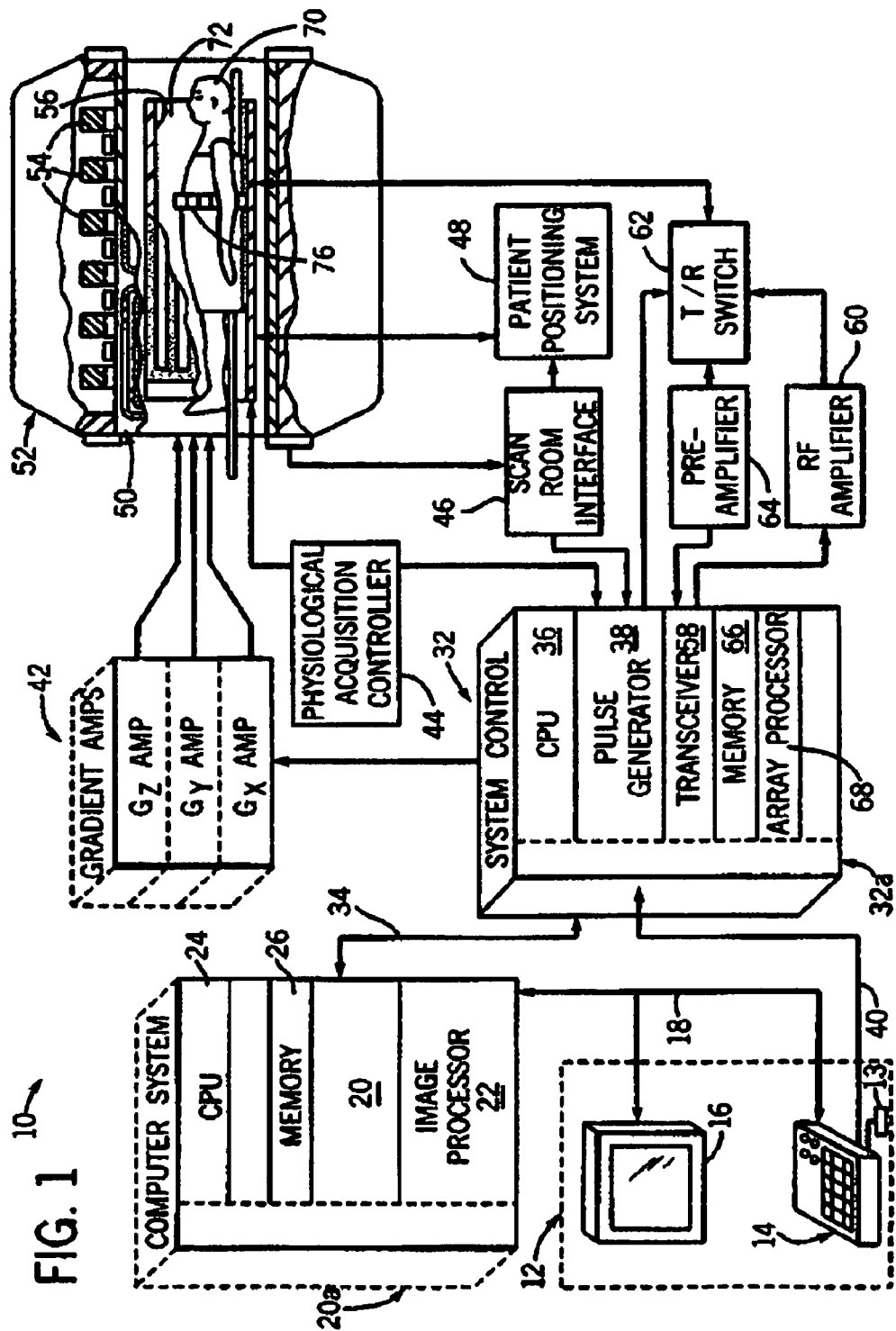
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14 and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links or may be fiber optic connections or wireless communication links or the like. The modules of computer system 20 may include an image processor module 22, a CPU module 24 and a memory module 26 that may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet 54 and a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the magnet assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 or coils 76 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

During a transmit sequence, the pulse generator 38 of the system control 32 instructs the transceiver 58, via transmit/receive switch 62, to cause the RF coil 56 or coils 76 to transmit RF pulses of given frequencies having particular profiles. For example, in a spin-echo based sequence, transceiver 58 will cause the RF coils 56 or 76 to transmit an excitation pulse at a particular frequency and transmit power for a particular time, in order to induce a net transverse magnetization in nuclei of a scan subject. Subsequent pulses transmitted by the RF coils 56 or 76 may have the same or a similar frequency, but will have different gain, amplitude, and duration attributes to cause a different change in magnetization in order to cause spin echoes. In general, the particular shapes of the RF pulses in a transmit sequence are varied to manipulate the net magnetization in nuclei of the scan subject. The attributes of RF pulses can be adjusted such that only spins within a given 2D or 3D portion of a scan subject are affected.

Techniques for designing RF pulses are described herein below which can produce improved magnitude profiles of the resulting magnetization by relaxing the phase constraint and optimizing the phase profiles. In one embodiment, a spinor-based, optimal control, optimal phase technique may be used to design arbitrary-tip-angle (e.g.; large and small tip angle) RF pulses (both parallel transmission and single channel). In another embodiment, small tip angle RF pulses (both parallel transmission and single channel) may be designed using a small-tip-angle (STA) pulse design without phase constraint that is formulated as a parameter optimization problem.

As mentioned, in one embodiment, arbitrary-tip-angle RF pulses may be designed using a spinor-based, optimal control and optimal phase pulse design technique. Embodiments use concepts from optimal control theory and are based on a spinor form Bloch equation. To achieve arbitrary-tip-angles (e.g., large and small tip angles), an optimal control framework is used to directly address the Bloch equation nonlinearity. The phase-relaxed, spinor based, optimal control pulse design is formulated as:

$$\text{Choose } b_1(t), \ldots, b_L(t) \text{ to minimize } J(b_1, \ldots, b_L) = \quad \text{Eqn. 6}$$

$$\|\alpha(T) - \alpha_{des}\|_{W_1}^2 + \|\|\beta(T)\| - \beta_{des}\|_{W_2}^2 + \kappa \sum_{l=1}^{L} \int_0^T |b_l(t)|^2 \, dt,$$

where J is a cost function, $\alpha(t)$ and $\beta(t)$ follow the Bloch equation and are length-M vectors that vertically concatenate spatial domain samples of the corresponding Cayley-Klein parameters in the spinor form Bloch equation where M is the number of spatial samples and t represents the time axis, L is the number of coils, $\alpha_{des}$ and $\beta_{des}$ are the desired (or target) Cayley-Klein vectors for magnetization at the terminal time T, $b_l(t)$ is the complex-valued RF pulse of the lth coil, l=1, 2, ..., L, $W_1$ and $W_2$ are diagonal matrices with their diagonal elements representing spatial weights, $\|\cdot\|_{w_1}^2$ and $\|\cdot\|_{w_2}^2$ are weighted $l_2$ norms, $|\cdot|$ denotes the magnitude operator, and $\kappa$ is a regularization parameter. In Eqn. 6, it is assumed that the gradient is refocused (i.e., then integral of the gradient waveform is zero) and therefore $\alpha(T)$ and $\alpha_{des}$ are real.

In the formulation of Eqn. 6, the underlying magnetization (i.e., the motion of the magnetization vectors) forms a dynamic system that is governed by the Bloch equation. The state variables or state vectors of the dynamic system are $\alpha(t)$ and $\beta(t)$ which are the Cayley-Klein parameters of the spinor form Bloch equation. The controls of the system are the RF pulses, $b_l(t)$, to be designed. The formulation provides a method to find the best controls that drive the state variables to a desired state (which corresponds to a desired magnitude profile of the magnetization) without using excessive RF power. In Eqn. 6, in the cost function, J, the first and second terms penalize the overall error in final magnetization and the third term approximately penalizes the RF power consumption. The phase of transverse magnetization is removed by a magnitude operation on $\beta(T)$. This permits a closed form gradient vector of the cost function (J) and the cost function (J) does not penalize the phase of the resulting magnetization.

To solve Eqn. 6, the spinor form Bloch equation is converted from a constrained optimization problem to an unconstrained optimization problem. First, the spinor form Bloch equation, as given in Eqn. 6, can be vectorized to the following form:

$$\begin{bmatrix} \dot{\alpha}(t) \\ \dot{\beta}(t) \end{bmatrix} = \underbrace{\begin{bmatrix} \mathrm{diag}\left\{\frac{i\gamma}{2}G(t)\cdot r_m\right\}_{m=1,\ldots,M} & \mathrm{diag}\left\{\frac{i\gamma}{2}\sum_{l=1}^{L}s_l^*(r_m)b_l^*(t)\right\}_{m=1,\ldots,M} \\ \mathrm{diag}\left\{\frac{i\gamma}{2}\sum_{l=1}^{L}s_l(r_m)b_l(t)\right\}_{m=1,\ldots,M} & \mathrm{diag}\left\{-\frac{i\gamma}{2}G(t)\cdot r_m\right\}_{m=1,\ldots,M} \end{bmatrix}}_{Q(b_1,\ldots,b_L,t)} \begin{bmatrix} \alpha(t) \\ \beta(t) \end{bmatrix},$$

Eqn. 7 where $r_m$ denotes the mth spatial location, $s_l$ denotes the transmit sensitivity of the lth coil, "*" denotes complex conjugate, and $\mathrm{diag}\{\cdot\}_{m=1,\ldots,M}$ denotes an M×M diagonal matrix. Q ($b_1, \ldots, b_L,t$) can be further written as an explicit form of $b_l(t)$ and $b_l(t)$ weighted by precomputed matrices. Then, two co-state vectors (also called Lagrange multipliers) $\sigma(t)$ (corresponding to $\alpha$) and $\tau(t)$ (corresponding to $\beta$) are introduced to convert the constrained problem in Eqn. 6 into an unconstrained one given by:

Choose $b_1(t), \ldots, b_L(t)$ to minimize $\bar{J}(b_1, \ldots, b_L) =$ Eqn. 8

$$\|\alpha(T) - \alpha_{des}\|_{W_1}^2 + \||\beta(T)| - \beta_{des}\|_{W_2}^2 +$$

$$\int_0^T \left\{ \sum_{l=1}^{L} \kappa|b_l(t)|^2 + [\sigma^H, \tau^H]\left( Q(b_1, \ldots, b_L, t)\begin{bmatrix}\alpha\\\beta\end{bmatrix} - \begin{bmatrix}\dot{\alpha}\\\dot{\beta}\end{bmatrix}\right)\right\}$$

dt.

To find an optimal solution to Eqn. 8, the first order necessary conditions are enforced resulting in:

$$\begin{bmatrix} \dot{\alpha}(t) \\ \dot{\beta}(t) \end{bmatrix} = Q(b_1, \ldots, b_L, t)\begin{bmatrix} \alpha(t) \\ \beta(t) \end{bmatrix},$$

Eqn. 9

$$\begin{bmatrix} \dot{\sigma}(t) \\ \dot{\tau}(t) \end{bmatrix} = Q(b_1, \ldots, b_L, t)\begin{bmatrix} \sigma(t) \\ \tau(t) \end{bmatrix},$$

$$\sigma^H \mathrm{diag}\left\{\frac{i\gamma}{2}s_l^*(r_m)\right\}_{m=1,\ldots,M}\beta +$$

$$\left(\tau^H \mathrm{diag}\left\{\frac{i\gamma}{2}s_l^*(r_m)\right\}_{m=1,\ldots,M}\alpha\right)^* + 2\kappa b_l = 0, \forall l.$$

The boundary conditions for the differential equations in Eqn. 9 are given by:

$\alpha(0)=[1,1,\ldots,1]^T$, $\beta(0)=[0,0,\ldots,0]^T$, $\sigma(T)=2W_1(\alpha(T)-\alpha_{des})$, $\tau(T)=2U\beta(T)$, where $U=\mathrm{diag}\{w_{2,m}-\beta_{des,m}^2 w_{2,m}^2/\sqrt{\beta_{des,m}^2 |\beta_m(T)|^2+\lambda}\}$, Eqn. 10 where $w_{2,m}$ is the mth diagonal element of $W_2$, $\beta_{des,m}$ is the mth element of $\beta_{des}$, $\beta_m(T)$ is the mth element of $\beta(T)$, and $\delta$ is a small constant introduced to overcome the non-differentiability of the magnitude operation at the origin. The differential equations with the boundary conditions in Eqn. 10 form a two-point boundary value problem that does not have closed form solution.

Figure 2:
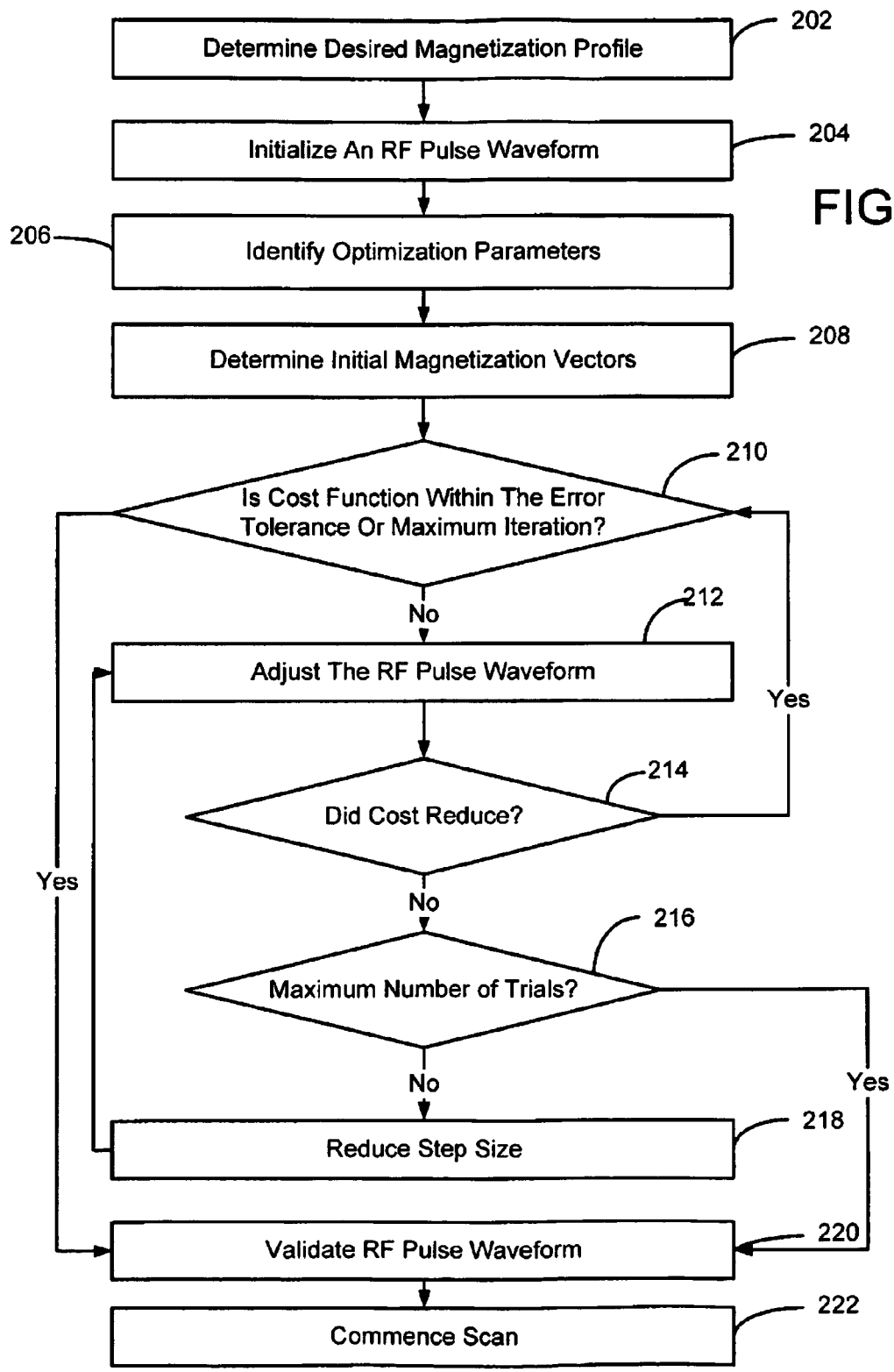
FIG. 2 illustrates an RF pulse design technique in accordance with an embodiment.

The minimization of the cost function, J, as given in Eqn. 8 above, may proceed in accordance with an optimization algorithm. In a preferred embodiment, a first order gradient descent optimization algorithm is used to solve Eqn. 8 with the optimality conditions as given by Eqns. 9 and 10. In alternative embodiments, other optimization algorithms may be used, for example, a second order gradient algorithm which computes the Hessian in addition to the first order gradient. FIG. 2 illustrates a technique for RF pulse design in accordance with an embodiment. At block 202, an operator of an MR system will enter a desired/target magnetization profile into a user interface of the system (such as console 12 of FIG. 1). The user may enter values describing the x, y and z magnetization directly, or the target magnetization can be derived by the system from a number of other parameters such as pulse type, flip angle, pulse duration, k-space trajectory, or the composite B1 field that is desired, etc. The target magnetization is then converted into the spinor domain ($\alpha_{des}$ and $\beta_{des}$). At block 204, the RF waveform of the controls, $b_l(t)$, is initialized using a known pulse design approach, for example, a non-iterative approach such as such as STA or LCLTA may be used to find values for $b_l(t)$. As known in the art, the appropriate type of pulse design approximation is determined by the type of pulse to be designed. The RF waveform approximated at block 204 will be used as an input to an optimization algorithm as described above. In some embodiments, the user may have the approximation performed separately and provide the result to the MR system. In other embodiments, the system may prompt the user to enter sufficient data at block 202 such that the MR system can automatically perform the approximation at block 204. Alternatively, the system may begin with a default, arbitrary RF waveform as an input to the optimization, instead of initializing with an approximation.

At block 206, the system can allow a user to select optimization algorithm parameters such as an error tolerance $\epsilon$, a maximum number of iterations K, a maximum adjustment or step size $\mu$, and a maximum number of trial step sizes, or the system can use default values. Various known techniques, such as the Armijo rule and the heuristic approach, can be used to choose $\mu$. The number of iterations and the error tolerance can be chosen based on, for example, the trade-off between precision and computational time and complexity. At block 208, the system determines the initial magnetization vectors ($\alpha^{(0)}(t)$ and $\beta^{(0)}(t)$) for all $0 \leq t \leq T$. For example, given $\alpha(0)$ and $\beta(0)$ from Eqn. 10 above, the spinor form Bloch equation can be integrated forward to obtain the magnetization vectors $\alpha^{(0)}(t)$ and $\beta^{(0)}(t)$ for all $0 \leq t \leq T$. In one embodiment, the integration is efficiently done by successive spinor domain rotations.

Once the initial optimization parameters are set, the system can begin iteratively minimizing the cost function to obtain the RF pulse waveform. The optimization technique is tailored to the phase relaxed RF pulse design of Eqn. 8. At block 210, the cost function $J(b_l^{(k)})$, as given by Eqn. 8, is determined and compared to the given error tolerance $\epsilon$. If the cost function $J(b_l^{(k)})$ is smaller than the given error tolerance (which means $b_l^{(k)}$ has satisfactory performance), the iterative algorithm will cease and the user can validate the RF pulse in simulations at block 220, then commence a scan sequence at block 222 using the RF pulse to acquire MR data and reconstruct an image. If the cost function is outside of the error tolerance at block 210, the control $b_l^{(k)}$ is updated (or adjusted) at block 212. First, the two co-state magnetization vectors (or Legrange multipliers) $\sigma^{(k)}(T)$ and $\tau^{(k)}(T)$ are evaluated using Eqn. 10. The spinor form Bloch equation is then integrated backward to obtain $\sigma^{(k)}(t)$ and $\tau^{(k)}(t)$, for all $0 \leq t \leq T$. These values are then used to update the control $b_l^{(k)}$ for $l=1, 2, \ldots, L$ at block 214 using:

$$b_l^{(k+1)}(t) = b_l^{(k)}(t) - \mu \left[ \sigma^H \text{diag}\left\{ \frac{i\gamma}{2} s_l^*(r_m) \right\}_{m=1,\ldots,M} \beta + \left( \tau^H \text{diag}\left\{ \frac{i\gamma}{2} s_l^*(r_m) \right\}_{m=1,\ldots,M} \alpha \right)^* + 2\kappa b_l \right],$$ Eqn. 11

If the updated controls produce an increased cost in cost function J of Eqn. 8 at block 214, the step size $\mu$ is considered too large and the algorithm is likely not converging. In such a case, the step size ($\mu$) may be decreased or otherwise changed (e.g., halved) at block 218 and Eqn. 11 can be evaluated again. This repeats until a decreased cost is found at block 214 or a maximum number of trial step sizes is reached at block 216. If a decreased cost is found, the Bloch equation is integrated forward to obtain updated magnetization vectors $\alpha^{(k+1)}(t)$ and $\beta^{(k+1)}(t)$ for all $0 \leq t \leq T$ using $\alpha(0)$ and $\beta(0)$, and $b_l^{(k+1)}(t)$, $l=1, 2, \ldots, L$, and the process returns to block 210. The cost function is reevaluated to determine whether the cost function is within the error tolerance or if the maximum number of iterations (K) is reached. If the RF pulse waveform, $b_l^{(k)}$, will produce a magnetization that is within the error tolerance or the maximum number of iterations is reached (K), the iterative algorithm will cease. Once the RF pulse waveform is satisfactorily designed, a user can validate the RF pulse in simulations at block 220 and then commence with a scan sequence at block 222 using the RF pulse to acquire MR data and reconstruct an image. If a decreased cost is not found at block 214 and the maximum number of trial step sizes is reached at block 216, the algorithm is deemed as converged and the iterative algorithm will cease. The process moves to block 220 and a user can validate the RF pulse in simulations and then commence with a scan sequence at block 222 using the RF pulse to acquire MR data and reconstruct an image.

As mentioned, the optimal control pulse design with optimal phase improves the homogeneity of the magnitude profile of the magnetization by relaxing the phase constraint and optimizing the phase profile. The technique described above can be used to design RF pulses of all dimensions (i.e., 1D, 2D, and 3D) with an arbitrary k-space trajectory (i.e., both separable and non-separable trajectories). The technique can be used to design both single channel and parallel transmission RF pulses. The technique is capable of designing parallel transmission pulses with an optimal phase profile and arbitrary tip angle simultaneously.

As mentioned previously, in another embodiment, small tip angle RF pulses may be designed using a small-tip-angle (STA) pulse design without phase constraint that is formulated as a parameter optimization problem. This embodiment is based on the STA approximation. The phase constraint in the STA pulse design is removed by including only the magnitude of the transverse magnetization (e.g., by taking the absolute value of the transverse magnetization profile) in the cost (or objective) function (see Eqn. 4 above) resulting in:

Choose b to minimize $J(b) = \||Sb| - p\|_w^2 + \lambda \|b\|_2^2$, Eqn. 12 where |Sb| denotes a vector whose individual element is the absolute value of the corresponding element in the vector Sb. In Eqn. 12, J(b) is the cost or objective function, p is the desired magnetization, S is the transmit sensitivity and $S=[S_1, S_2, \ldots, S_L]$ is an M×LN matrix where M is the number of voxels and N is the number of time points, b is the RF pulse waveform to be designed and $b=[(b_1)^T, (b_2)^T, \ldots, (b_L)^T]^T$ is a length-LN vector where L is the number of coils, W is a spatial weighting matrix and $\lambda$ is a positive scalar (referred to as regularization parameter). In addition, in Eqn. 12, p is only a magnitude of the desired magnetization profile, for example, only the magnitude of the desired magnetization is used or only the desired magnitude profile for the desired magnetization is provided (or prescribed). The overall error of the final magnetization profile is represented by the first term in Eqn. 12, RF power is represented by the second term in Eqn. 12 and $\lambda$ balances the error and RF power terms. Unlike the standard formulation in Eqn. 4, the formulation in Eqn. 6 does not have a closed form solution.

The minimization of the cost function, J, as given in Eqn. 12 above, proceeds in accordance with an optimization algorithm. In a preferred embodiment, a modified version of a standard nonlinear conjugate gradient (CG) algorithm is used to iteratively solve the optimization problem in Eqn. 12. The modification is to adapt the standard nonlinear CG algorithm to the complex parameter case based on the complex gradient vector of the cost function, J(b). The cost or objective function, J(b), in Eqn. 12 can be rewritten as:

$$J(b) = (|Sb|^T - p^T)W(|Sb| - p) + \lambda \|b\|_2^2$$

$$= |Sb|^T W |Sb| + p^T W p - 2p^T W |Sb| + \lambda b^H b$$

$$= b^H S^H W S b + p^T W p - 2\| P W S b \|_1 + \lambda b^H b,$$ Eqn. 13 where the $l_1$ norm is defined as (for a given vector $x \triangleq [x_1, x_2, \ldots, x_M]^T$)

$$\|x\|_1 = \sum_k |x_k| \qquad \text{Eqn. 14}$$

and $$P = \text{diag}\{p_1, p_2, \ldots, p_M\}. \qquad \text{Eqn. 15}$$

Note b is a complex vector and therefore the conventional gradient has to be redefined before further derivation. The following definition of the complex gradient operator can be used to generate a complex gradient vector that can be used for gradient based optimization algorithms:

$$\nabla_b J(b) \triangleq \nabla_{Re\{b\}} J(b) + \nabla_{Im\{b\}} J(b), \qquad \text{Eqn. 16}$$

where $Re\{b\}$ and $Im\{b\}$ represents the real and imaginary components of a complex vector, respectively.

To obtain the complex gradient $\nabla_b J(b)$, the gradient of $J(b)$ is first calculated with respect to $$b_{new} \triangleq \begin{bmatrix} Re\{b\} \\ Im\{b\} \end{bmatrix} \qquad \text{Eqn. 17}$$

and the resulting vector reordered. Let:

$$S_{new} \triangleq \begin{bmatrix} Re\{S\} & -Im\{S\} \\ Im\{S\} & Re\{S\} \end{bmatrix} \qquad \text{Eqn. 18}$$

and $W_{new} \triangleq \text{diag}(W,W)$. In Eqn. 13, $b^H b = b_{new}^T b_{new}$ and it can be shown that $b^H S^H W S b = b_{new}^T S_{new}^T W_{new} S_{new} b_{new}$, which yields:

$$\nabla_{b_{new}} J = 2 S_{new}^T W_{new} S_{new} b_{new} + 2\lambda b_{new} - 2\nabla_{b_{new}} \|Qb\|_1, \qquad \text{Eqn. 19}$$

where $Q = PWS$. To obtain $\nabla_{b_{new}} \|Qb\|_1$, the following is defined:

$$Q_{new} \triangleq \begin{bmatrix} Re\{Q\} & -Im\{Q\} \\ Im\{Q\} & Re\{Q\} \end{bmatrix}. \qquad \text{Eqn. 20}$$

The $l_1$ norm is differentiable everywhere except the origin. To accommodate this problem, an approximation of the $l_1$ norm is:

$$\|Qb\|_1 \approx \sum_{m=1}^M \sqrt{|(Qb)_m|^2 + \delta} \qquad \text{Eqn. 21}$$

$$= \sum_{m=1}^M \sqrt{(Re\{(Qb)_m\})^2 + (Im\{(Qb)_m\})^2 + \delta},$$

where $\delta$ is a small constant. Denoting the mth row of $Q_{new}$ as $q_m^T$, m=1, 2, ..., 2M, Eq. 19 becomes:

$$\|Qb\|_1 \approx \sum_{m=1}^M \sqrt{(q_m^T b_{new})^2 + (q_{M+m}^T b_{new})^2 + \delta} \qquad \text{Eqn. 22}$$

-continued $$= \sum_{m=1}^M \sqrt{b_{new}^T q_m q_m^T b_{new} + b_{new}^T q_{M+m} q_{M+m}^T b_{new} + \delta}.$$

Therefore, the gradient of $\|Qb\|_1$ is:

$$\nabla_{b_{new}} \|Qb\|_1 = \sum_{m=1}^M \frac{q_m q_m^T b_{new} + q_{M+m} q_{M+m}^T b_{new}}{\sqrt{b_{new}^T q_m q_m^T b_{new} + b_{new}^T q_{M+m} q_{M+m}^T b_{new} + \delta}} \qquad \text{Eqn. 23}$$

$$= [q_1, \ldots, q_M, q_{M+1}, \ldots, q_{2M}]$$
$$\text{diag}\{v_1, \ldots, v_M, v_1, \ldots, v_M\}$$
$$[q_1, \ldots, q_M, q_{M+1}, \ldots, q_{2M}]^T b_{new}$$
$$= Q_{new}^T \text{diag}\{v_1, \ldots, v_M, v_1, \ldots, v_M\} Q_{new} b_{new}$$
$$= S_{new}^T \text{diag}\{p_1^2 w_1^2 v_1, \ldots, p_M^2 w_M^2 v_M, p_1^2 w_1^2 v_1, \ldots,$$
$$p_M^2 w_M^2 v_M\} S_{new} b_{new}$$

where:

$$v_m = (b_{new}^T q_m q_m^T b_{new} + b_{new}^T q_{M+m} q_{M+m}^T b_{new} + \delta)^{-1/2} \qquad \text{Eqn. 24}$$
$$= [(Q_{new} b_{new})_m^2 + (Q_{new} b_{new})_{M+m}^2 + \delta]^{-1/2}$$
$$= [|(PWSb)_m|^2 + \delta]^{-1/2}$$

for m=1, 2, ..., M. Combining Eqn. 19 and Eqn. 23 yields:

$$\nabla_{b_{new}} J = 2 S_{new}^T \text{diag}\{w_1 - p_1^2 w_1^2 v_1, \ldots, w_M - p_M^2 w_M^2 v_M, w_1 - p_1^2 w_1^2 v_1, \ldots, w_M - p_M^2 w_M^2 v_M\} S_{new} b_{new} + 2\lambda b_{new}. \qquad \text{Eqn. 25}$$

Accordingly, the complex gradient of $J(b)$ is:

$$\nabla_b J(b) = 2(S^H U S + \lambda I) b \qquad \text{Eqn. 26}$$

and $$U = \text{diag}\left\{ w_m - \frac{p_m^2 w_m^2}{\sqrt{|(PWSb)_m|^2 + \delta}} \right\}_{m=1,\ldots,M}, \qquad \text{Eqn. 27}$$

where $|(PWSb)_m|$ denotes the absolute value of the mth component of the length-M vector PWSb and $\delta$ is a small constant introduced to overcome the non-differentiability of $l_1$ norm at the origin.

Figure 3:
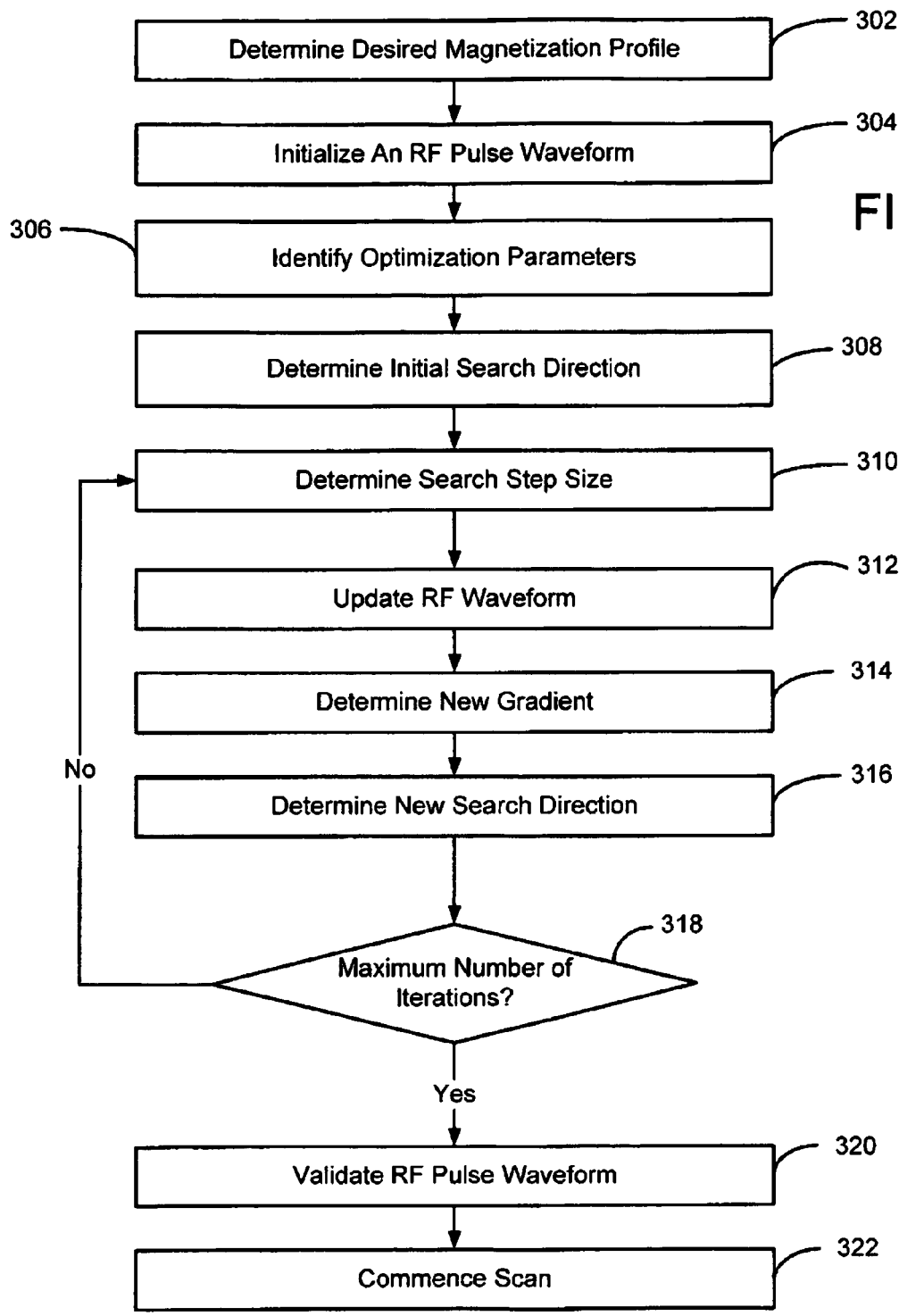
FIG. 3 illustrates an RF pulse design technique in accordance with an embodiment.

FIG. 3 illustrates a technique for RF pulse design in accordance with an embodiment. The technique determines an optimal phase pattern that provides the lowest combined magnitude magnetization profile error and RF power. As mentioned above, a modified version of the standard nonlinear CG algorithm is used to iteratively solve the optimization problem in Eqn. 12. At block 302, an operator of an MR system will enter a desired/target magnetization profile into a user interface of the system (such as console 12 of FIG. 1). The user may enter values describing the x, y, and z magnetization directly or the target magnetization can be derived by the system from a number of other parameters such as pulse type, flip angle, pulse duration, k-space trajectory, or the composite B1 field that is desired, etc. As discussed above with respect to Eqn. 12, only the magnitude of the desired magnetization profile is used. At block 304, the RF waveform, b, is initialized using a known pulse design approach such as the standard STA approach as given above in Eqn. 5. As known in the art, the appropriate type of pulse design approximation is determined by the type of pulse to be designed. The RF waveform approximated at block 304 will be used as an input to the optimization algorithm. In some embodiments, the user may have the approximation performed separately and provide the result to the MR system. In other embodiments, the system may prompt the user to enter sufficient data at block 302 such that the MR system can automatically perform an approximation at block 304. Alternatively, the system may begin with a default, arbitrary RF waveform as an input to the optimization, instead of initializing with an approximation.

At block 306, the system can allow a user to select optimization parameters such as a maximum number of iterations K and linear search constants (for example, $\alpha \in (0,0.5)$, $\beta \in (0,1)$). At block 308, an initial search direction, $d_0$, is determined using:

$$d_0 = -g_0 \qquad \text{Eqn. 29}$$

Once the initial optimization parameters are set, the system can begin iteratively minimizing the cost function to obtain the RF pulse waveform. At block 310, a backtracking line search is used to find a search step size, $\tau$. In a preferred embodiment, the optimal step size is found at each iteration. First, the step size is initialized, e.g., $\tau=1$. Then the gradient is calculated using:

$$\nabla J_k = \alpha \cdot Re(g_k d_k) \qquad \text{Eqn. 30}$$

The constant $\alpha$ controls the tolerable ratio of the actual decrease of J to the prediction based on linear extrapolation. The step size is then decreased as necessary until the Wolfe condition is satisfied, as given by:

$$\text{While } J(b^{[k]} + \tau d_k) > J(b^{[k]}) + \tau \Delta J_k$$

$$\tau \leftarrow \beta \tau \qquad \text{Eqn. 31}$$

The constant $\beta$ is used to control the crudeness of the step size search. The value of the step size, $\tau$, found when the Wolfe condition is satisfied is then used to update the RF waveform at block 312 as given by:

$$b^{[k+1]} = b^{[k]} + \tau d_k \qquad \text{Eqn. 32}$$

At block 314, a new gradient is determined using the RF waveform as determined at block 312 and Eqn. 26 above. At block 316, a new search direction is determined using:

$$\mu = \frac{\|g_{k+1}\|_2^2}{\|g_k\|_2^2}, \, d_{k+1} = -g_{k+1} + \mu_k d_k \qquad \text{Eqn. 33}$$

At block 318, if the maximum number of iterations K has not been reached, the process returns to step 310. If the maximum number of iterations has been reached, a user can validate the RF pulse in simulations at block 320, then commence with a scan sequence at block 322 using the RF pulse to acquire MR data and reconstruct an image.

The technique can be used to design RF pulses for B1 inhomogeneity correction applications and for reduced FOV excitation. For B1 inhomogeneity correction applications, the phase relaxed STA technique described above allows a spatially varying phase and therefore produces a magnitude profile of the magnetization with improved homogeneity. In addition, the technique generates more homogeneous excitation throughout the region-of-interest. For reduced FOV excitation applications, the technique generates higher spatial selectivity (e.g., a more homogeneous passband signal and smaller stopband signal). The technique also generates an optimal phase profile. The technique can be used to design RF pulses of all dimensions (i.e., 1D, 2D, and 3D) with an arbitrary k-space trajectory (i.e., both separable and non-separable) as long as the STA assumptions hold. The technique can be used to design both single channel and parallel transmission RF pulses without phase constraints.

Figure 4:
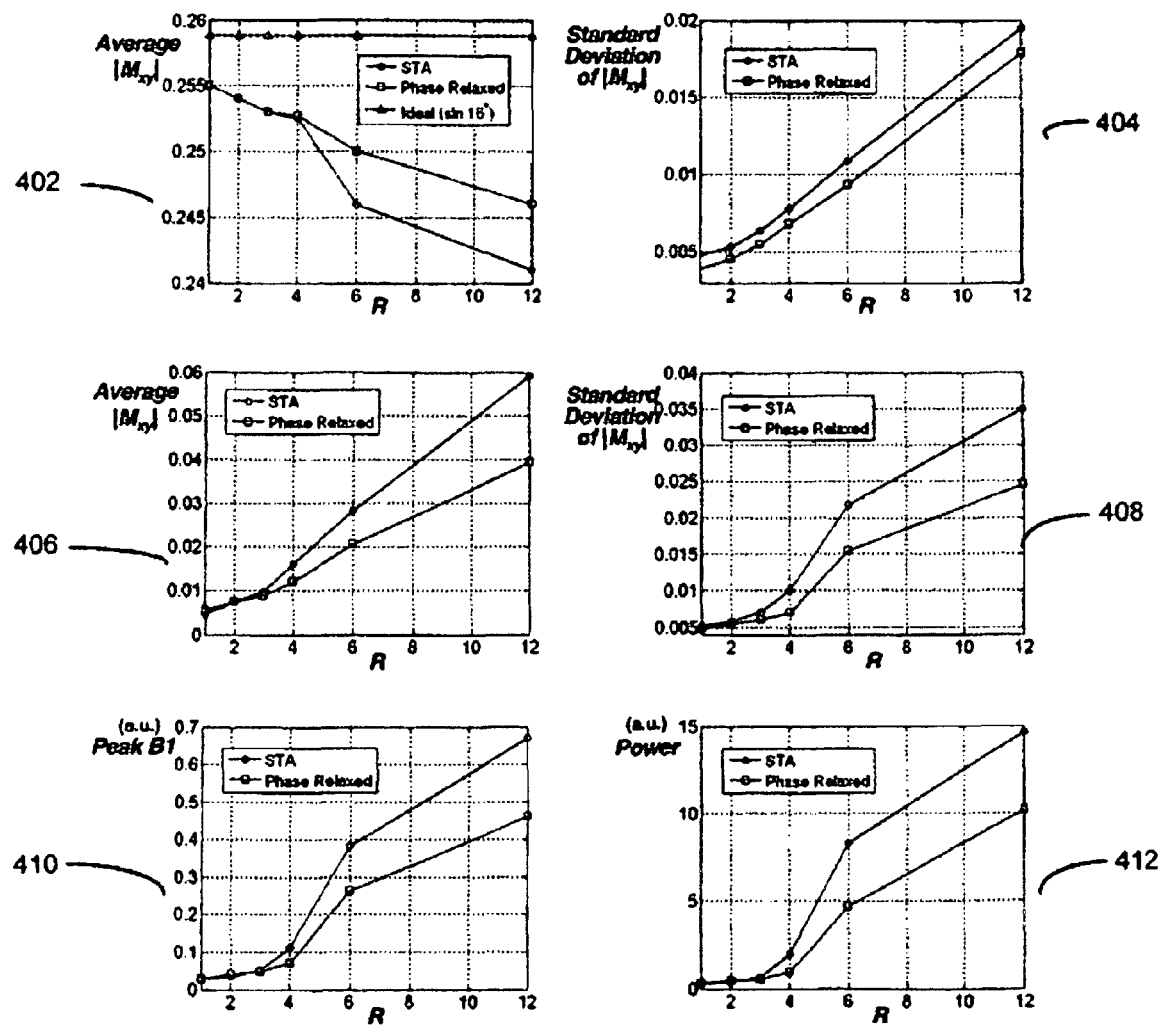
FIG. 4 is a series of comparison graphs of parameters produced by the phase-relaxed STA pulse design and parameters produced by a conventional STA pulse design.

FIG. 4 is a series of comparison graphs of parameters produced by the phase-relaxed STA pulse design for reduced field of view (FOV) excitation and parameters produced by a conventional STA pulse design for reduced FOV excitation. The graphs in FIG. 4 compare the designs for various acceleration factors (R). Graph 402 compares the designs with respect to the mean signal in the passband, graph 404 compares the designs with respect to the standard deviation of the passband signal, graph 406 compares the designs with respect to the mean signal in the stopband and graph 408 compares the designs with respect to the standard deviation of the stopband signal. Graph 410 compares the designs with respect to the peak B1 amplitude that is defined as the maximum RF pulse magnitude along time and across different channels. Graph 412 compares the designs with respect to RF power that is defined as the integral of squared RF pulse magnitude summed over all channels. For acceleration factors greater than two (2), the phase-relaxed STA pulse design has a more homogeneous passband signal, smaller stopband signal, smaller peak B1 and lower RF power. The advantage of the phase relaxed STA pulse design continues to increase with increasing acceleration factors.

Figure 5:
FIG. 5 illustrates a comparison of exemplary one dimensional (1D) magnitude profiles of the two dimensional (2D) magnetization for 2D RF pulses designed using the technique of FIG. 2, the technique of FIG. 3 and a conventional STA pulse design.
Figure 5:
Figure 5:
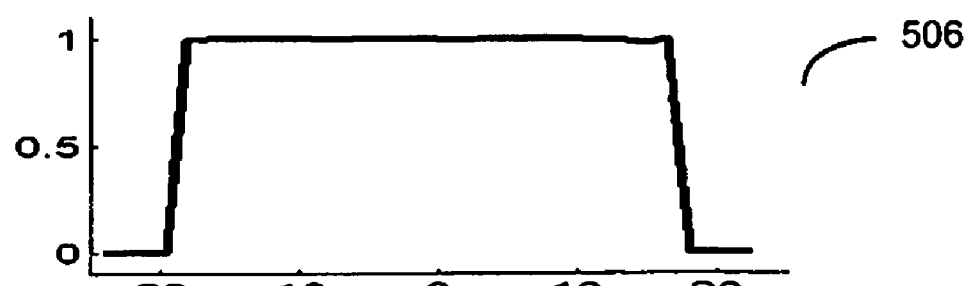

FIG. 5 illustrates a comparison of exemplary one dimensional (1D) magnitude profiles of the two dimensional (2D) magnetization for 2D RF pulses designed using the technique of FIG. 2, the technique of FIG. 3 and a conventional STA pulse design. The exemplary 1D magnitude profiles are for 2D RF pulses designed for B1 inhomogeneity correction. Graph 502 illustrates an exemplary 1D magnitude profile of 2D magnetization ($M_{xy}$) for an RF pulse designed using a conventional STA pulse design with a flat phase. Graph 504 illustrates an exemplary 1D magnitude profile of 2D magnetization ($M_{xy}$) for an RF pulse designed using the phase relaxed STA technique with optimal phase described above with respect to FIG. 3. Graph 506 illustrates an exemplary 1D magnitude profile of 2D magnetization ($M_{xy}$) for an RF pulse designed using the optimal control, optimal phase technique described above with respect to FIG. 2. As shown in FIG. 5, both the phase relaxed STA technique with optimal phase and the optimal control, optimal phase technique produce a more homogeneous magnitude profile than the conventional STA pulse design.

A technical effect of embodiments of the invention is the ability to utilize improved RF pulses in MR image acquisitions.

Computer-executable instructions for designing RF pulses are described which can produce improved magnitude profiles of the resulting magnetization by relaxing the phase constraint and optimizing the phase profiles according to the above-described methods may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A method for magnetic resonance (MR) imaging comprising:
    determining at least one RF pulse profile;
    identifying a set of desired magnetization parameters;
    iteratively adjusting the at least one RF pulse profile based on the set of desired magnetization parameters using a spinor-based, phase relaxed, optimal control formulation;
    transmitting at least one RF pulse using an RF coil array, the at least one RF pulse based on the at least one adjusted RF pulse profile;
    acquiring MR imaging data using at least one RF coil; and
    storing the MR image data in memory.

2. A method according to claim 1, wherein the at least one RF pulse profile is determined using at least one of a small-tip-angle (STA) approximation and a linear class large tip angle (LCLTA) approximation.

3. A method according to claim 1, wherein identifying the set of desired magnetization parameters includes prompting a user to identify a desired magnetization profile.

4. A method according to claim 3, wherein iteratively adjusting the at least one RF pulse profile comprises:
    expressing a spinor form, phase relaxed cost function describing an error in a magnetization of the at least one RF pulse profile compared to the desired magnetization profile; and
    minimizing the spinor form, phase relaxed cost function.

5. A method according to claim 1, wherein the optimal control formulation is a first order gradient descent optimization algorithm.

6. A method according to claim 1, wherein causing an RF coil array to transmit includes causing the RF coil array to transmit parallel transmission RF pulses.

7. A method according to claim 1, further comprising reconstructing an MR image from the MR image data and displaying the MR image to a user.

8. A magnetic resonance (MR) imaging apparatus comprising:
    a plurality of gradient coils positioned about a bore of a magnet;
    an RF transceiver system and switch controlled by a pulse module to transmit RF signals to an RF coil array to acquire MR images; and
    a computer operatively connected to the pulse module and programmed to:
        determine at least one RF pulse profile;
        determine a set of desired magnetization parameters;
        iteratively adjust the at least one RF pulse profile based on the set of desired magnetization parameters using a spinor-based, phase relaxed, optimal control formulation;
        cause the pulse module to generate RF pulses for transmission by the RF coil array based on the at least one adjusted RF pulse profile to acquire MR image data; and
        at least temporarily store the MR image data in memory.

9. A MR imaging apparatus according to claim 8, wherein the at least one RF pulse profile is determined using at least one of a small-tip-angle (STA) approximation and a linear class large tip angle (LCLTA) approximation.

10. An MR imaging apparatus according to claim 8, wherein determining the set of desired magnetization parameters includes prompting a user to identify a desired magnetization profile.

11. An MR imaging apparatus according to claim 10, wherein iteratively adjusting the at least one RF pulse profile comprises;
    expressing a spinor form, phase relaxed cost function describing an error in a magnetization of the at least one RF pulse profile compared to the desired magnetization profile; and
    minimizing the spinor form, phase relaxed cost function.

12. An MR imaging apparatus according to claim 8, wherein the RF coil array is arranged for parallel transmission.

13. An MR imaging apparatus according to claim 8, wherein the optimal control formulation is based on a first order gradient descent optimization algorithm.

14. An MR imaging apparatus according to claim 8, wherein the computer is further programmed to reconstruct an MR image from the MR image data and provide the MR image to a display.

15. A method for magnetic resonance (MR) imaging comprising:
    determining at least one RF pulse profile;
    identifying a set of desired magnetization parameters;
    iteratively adjusting the at least one RF pulse profile based on the set of desired magnetization parameters using a phase relaxed small-tip-angle formulation configured to generate an optimal phase profile;
    transmitting at least one RF pulse using an RF coil array, the at least one RF pulse based on the at least one adjusted RF pulse profile;
    acquiring MR imaging data using at least one RF coil; and
    storing the MR image data in memory.

16. A method according to claim 15, wherein the at least one RF pulse profile is determined using a small-tip-angle (STA) approximation.

17. A method according to claim 15, wherein the computer is further programmed to iteratively adjust the at least one RF pulse profile based on a nonlinear conjugate gradient optimization algorithm.

18. A method according to claim 15, wherein identifying a set of desired magnetization parameters includes prompting a user to identify a desired magnetization profile.

19. A method according to claim 15, causing an RF coil array to transmit includes causing the RF coil array to transmit parallel transmission RF pulses.

20. A method according to claim 15, further comprising reconstructing an MR image from the MR image data and displaying the MR image to a user.

* * * * *